United States Patent [19]

Hoover

[11] 3,996,456

[45] Dec. 7, 1976

[54] RECURSIVE INTERPOLATION

[75] Inventor: Bradley R. Hoover, Hamilton, Ohio

[73] Assignee: Armco Steel Corporation, Middletown, Ohio

[22] Filed: Feb. 13, 1975

[21] Appl. No.: 549,466

[52] U.S. Cl. .............................. 235/152; 340/172.5
[51] Int. Cl.² ........................................ G06F 15/34
[58] Field of Search .............. 235/151, 152, 152 IE, 235/156; 340/172.5, 324 A, 324 R, 347 DA, 347 SH; 444/1

[56] References Cited

UNITED STATES PATENTS

| | | | |
|---|---|---|---|
| 3,564,230 | 2/1971 | Carossi | 235/152 IE |
| 3,619,582 | 11/1971 | Iwamoto et al. | 235/152 IE |
| 3,720,814 | 3/1973 | Klein | 235/152 IE |
| 3,763,363 | 10/1973 | Saita et al. | 235/152 IE |
| 3,789,203 | 1/1974 | Catherall et al. | 235/152 IE |
| 3,821,524 | 6/1974 | Wahl | 235/152 IE |
| 3,831,167 | 8/1974 | Tewksbury | 340/347 DA |
| 3,846,625 | 11/1974 | Sasayama | 235/152 IE |

*Primary Examiner*—Gareth D. Shaw
*Assistant Examiner*—C. T. Bartz
*Attorney, Agent, or Firm*—Melville, Strasser, Foster & Hoffman

[57] ABSTRACT

A system for interpolatively displaying the values of a one-dimensional array of data sources is disclosed. The output signals are multiplexed and successively made available to the input of a tandem of samples and hold circuits. Stored data from the tandem of sample and hold circuits is applied in parallel format to a computation unit which produces a continuous signal interpolatively representing the values of each spatially adjacent pair of data sources. Control circuitry provides appropriately timed sample and hold signals to the tandem of sample and hold circuits as well as initialization signals to the computation unit. The computation unit is initialized on every sample period in synchronism with the multiplexer and sample and hold tandem.

The basic one-dimensional recursive interpolation scheme disclosed may also be utilized in a dual re-iterative manner to display the interpolated status of a two-dimensional data source array such as a two-dimensional array of thermocouples situated in proximity to the face of a continuous casting mold.

49 Claims, 18 Drawing Figures

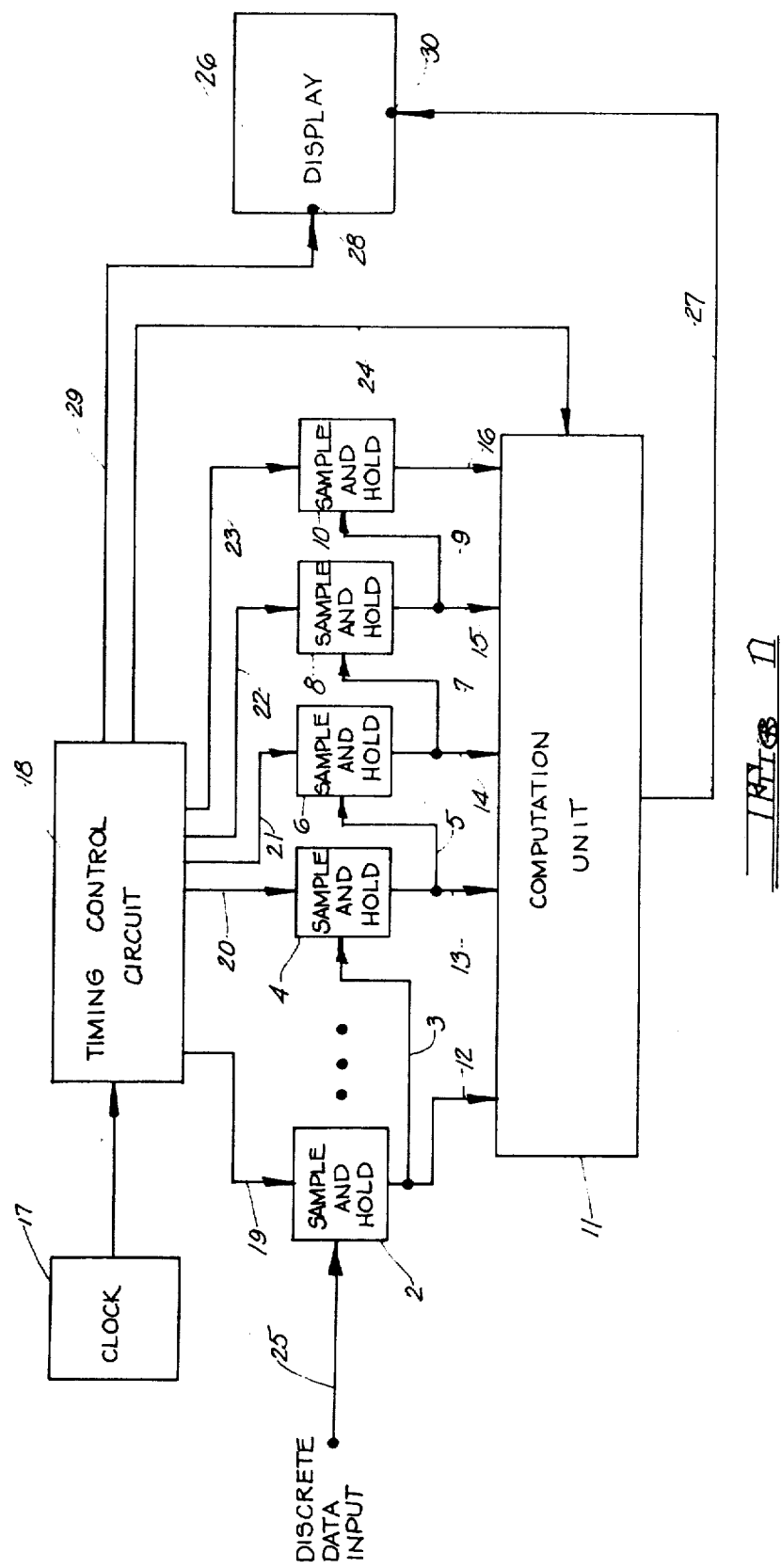

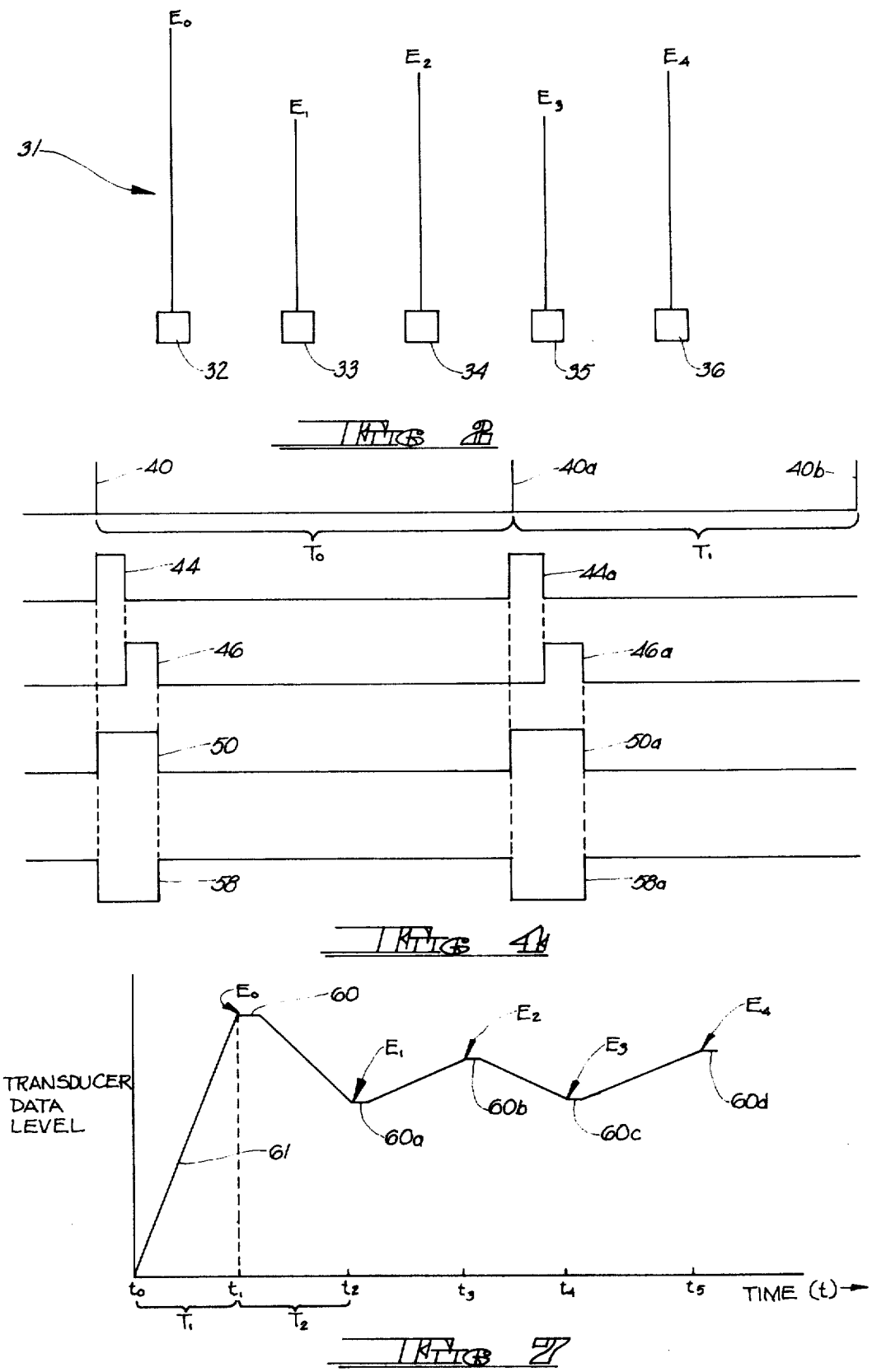

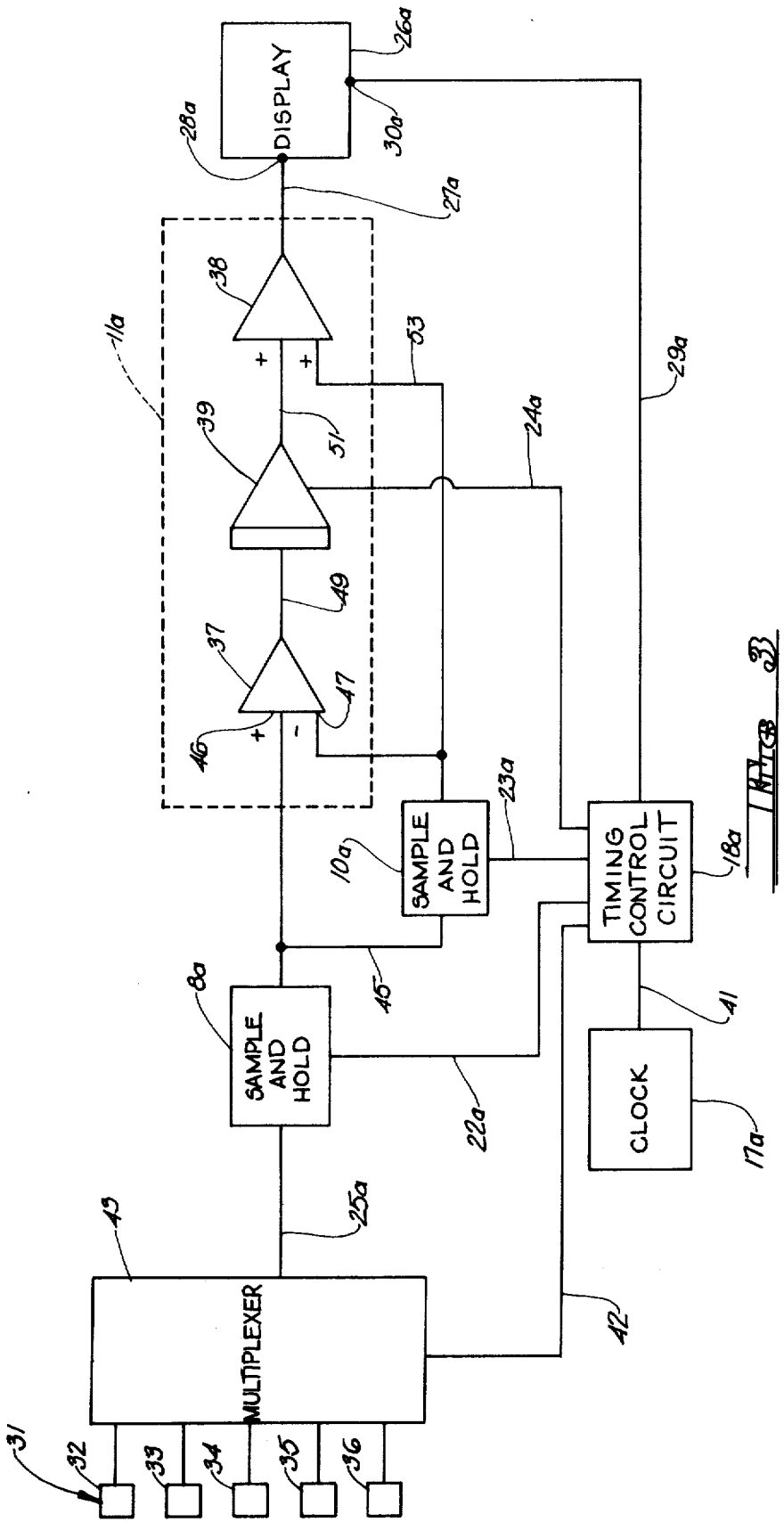

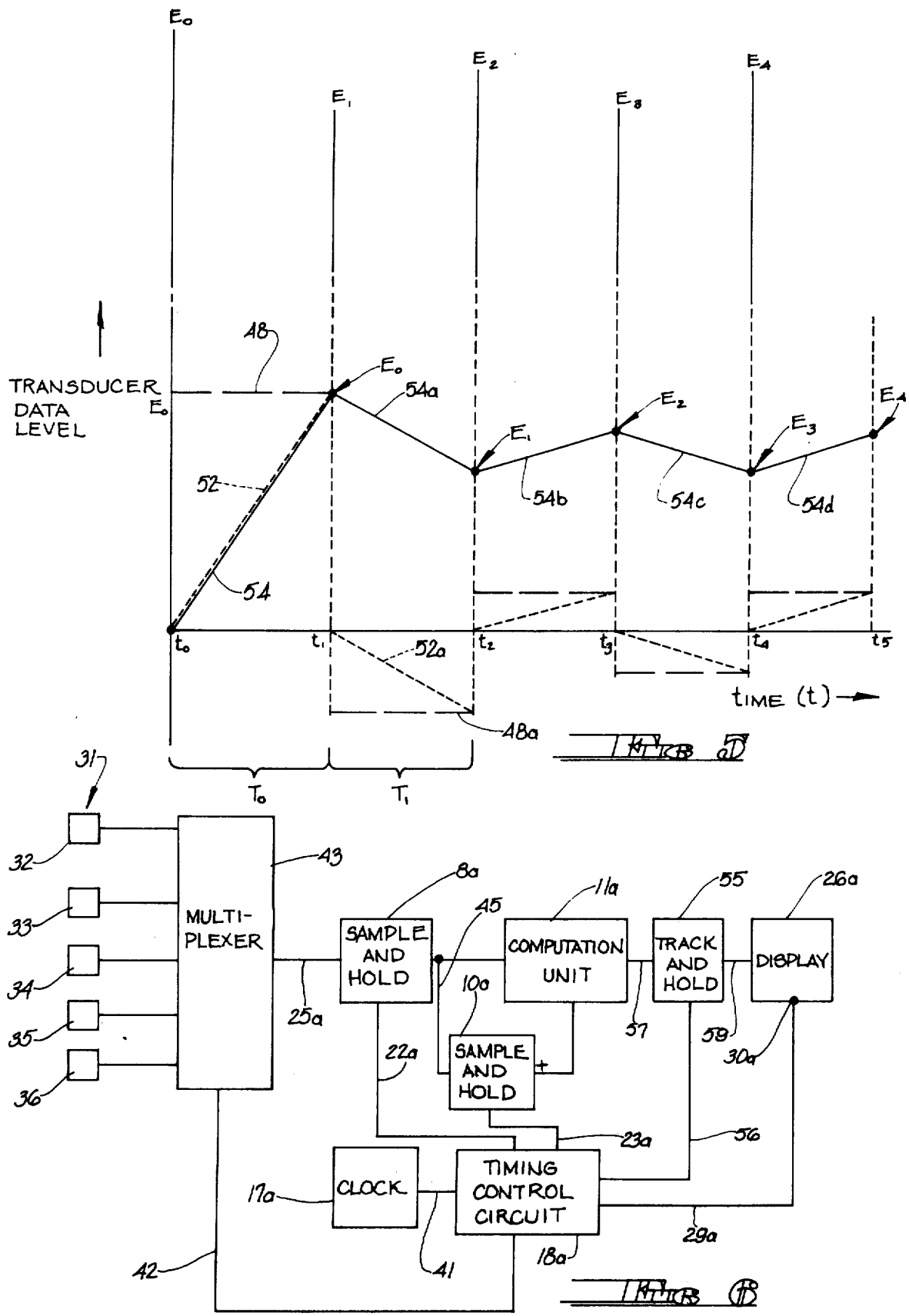

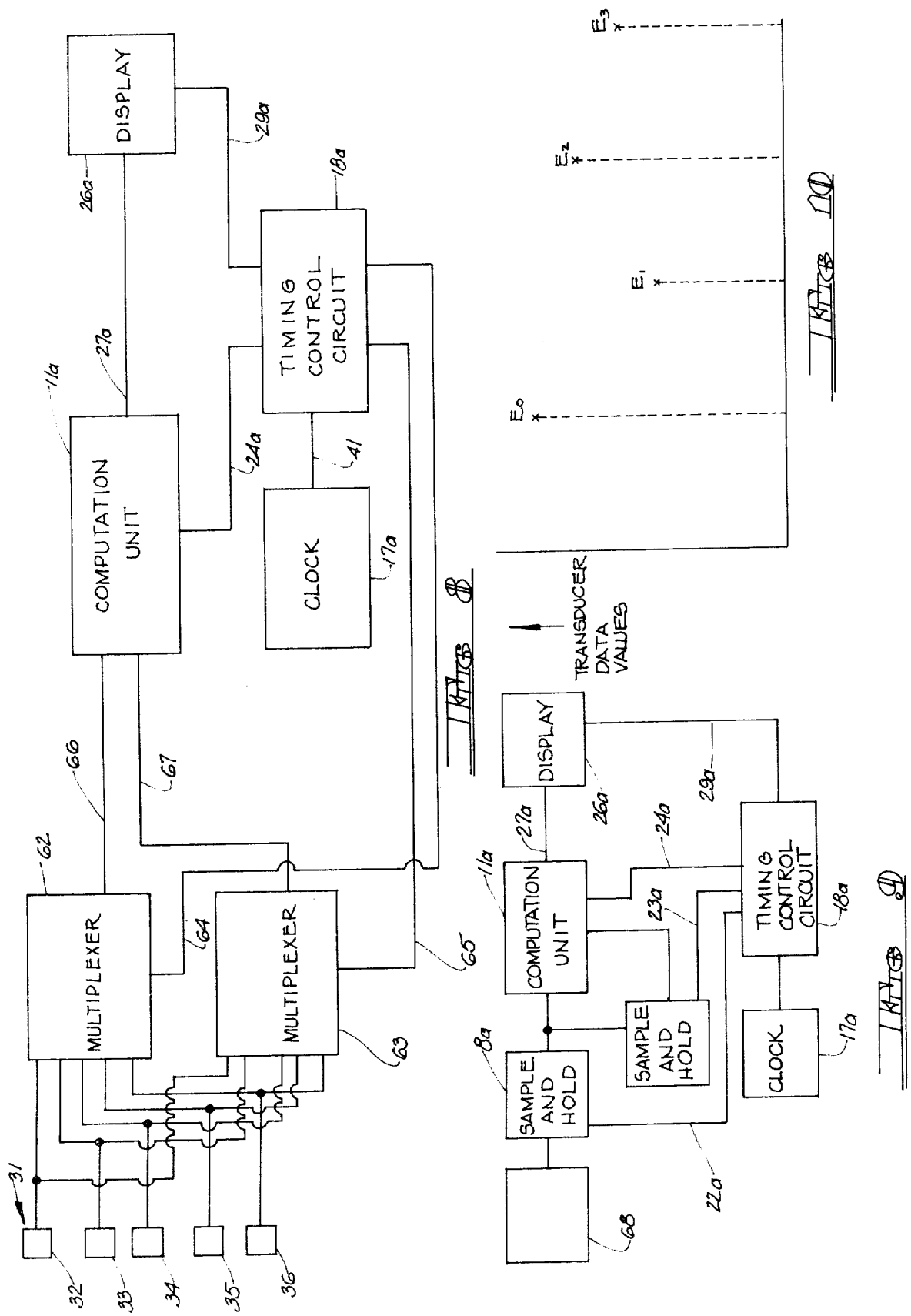

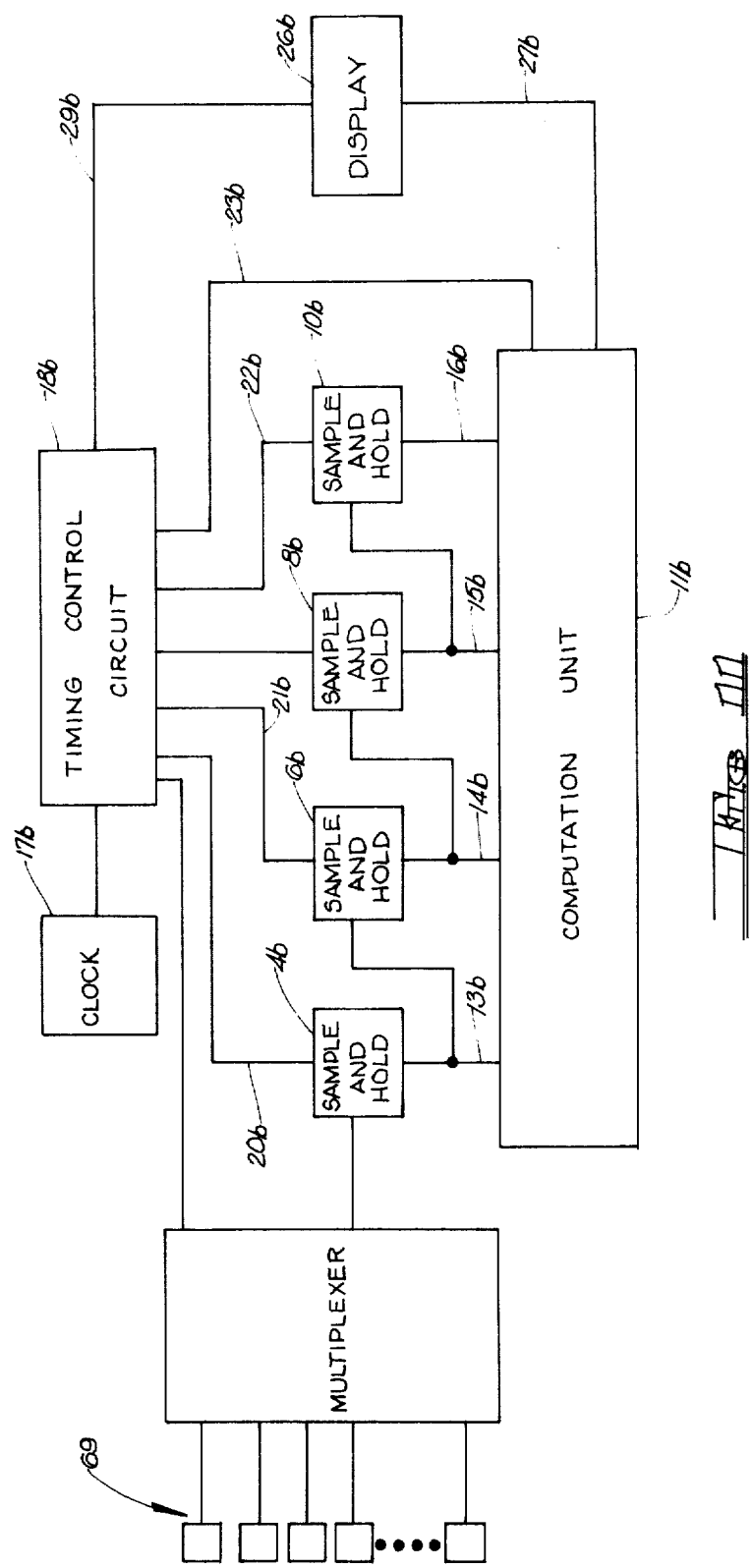

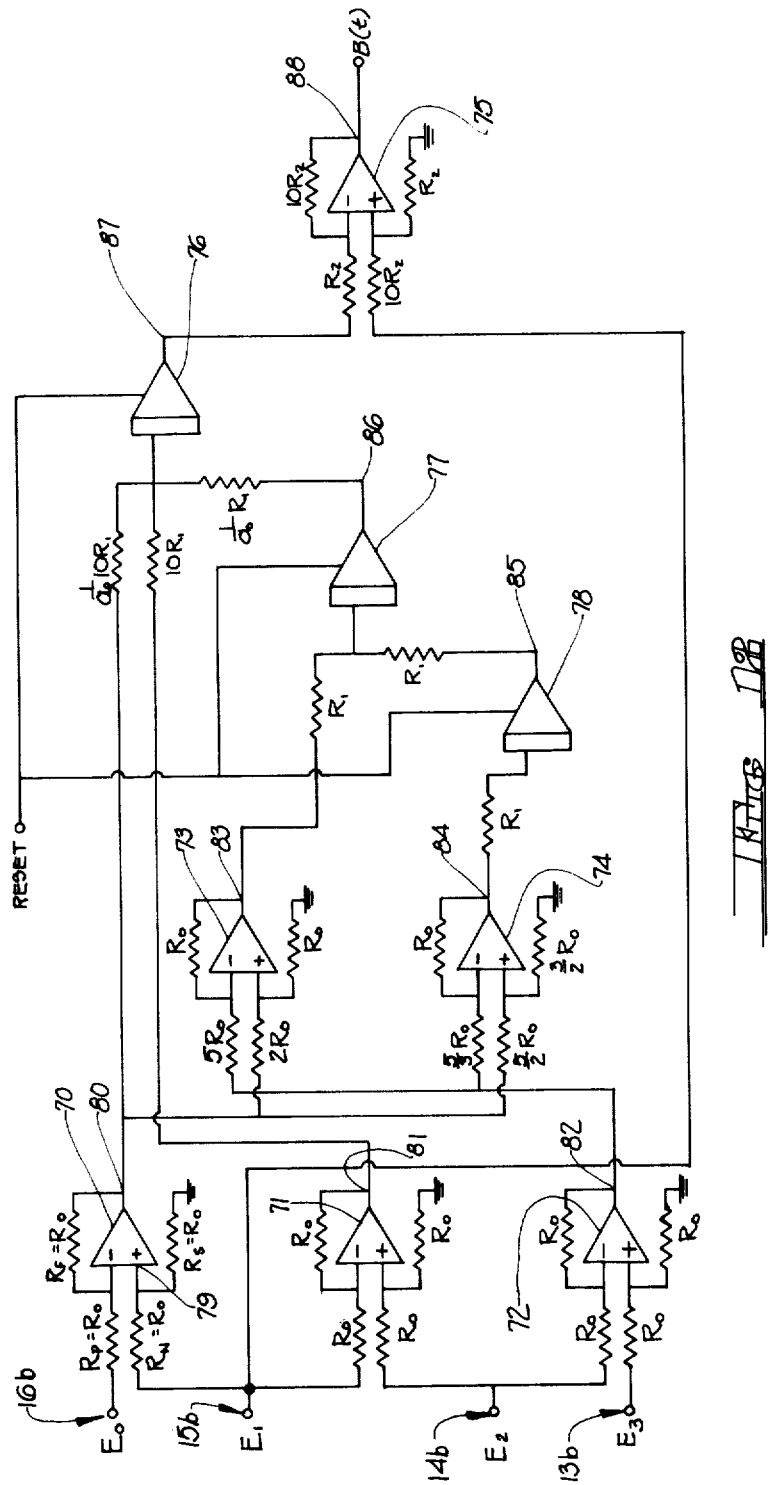

TABLE 1

| NODE | VOLTAGE |
|---|---|
| 80 | $E_{10}$ |
| 81 | $E_{21}$ |
| 82 | $E_{32}$ |
| 83 | $(.4E_{10} - .2E_{32})$ |
| 84 | $(.6E_{10} - .6E_{32})$ |
| 85 | $-(.6E_{10} - .6E_{32})\,t/T$ |
| 86 | $-(.4E_{10} - .2E_{32})\,t/T + (.3E_{10} - .3E_{32})(t/T)^2$ |
| 87 | $-(.1E_{21} + .1a_0 E_{10})(t/T) + a_0(.2E_{10} - .1E_{32})(t/T)^2 - a_0(.1E_{10} - .1E_{32})(t/T)^3$ |
| 88 | $E_1 + (E_{21} + a_0 E_{10})\,t/T - a_0(2E_{10} - E_{32})(t/T)^2 + a_0(E_{10} - E_{32})(t/T)^3$ |

TABLE 2

| SAMPLE PERIOD | SAMPLE AND HOLD | | | |
|---|---|---|---|---|
| | 4b | 6b | 8b | 10b |
| $T_1$ | $E_0$ | 0 | 0 | 0 |
| $T_2$ | $E_1$ | $E_0$ | 0 | 0 |
| $T_3$ | $E_2$ | $E_1$ | $E_0$ | 0 |
| $T_4$ | $E_3$ | $E_2$ | $E_1$ | $E_0$ |
| ⋮ | ⋮ | ⋮ | ⋮ | ⋮ |

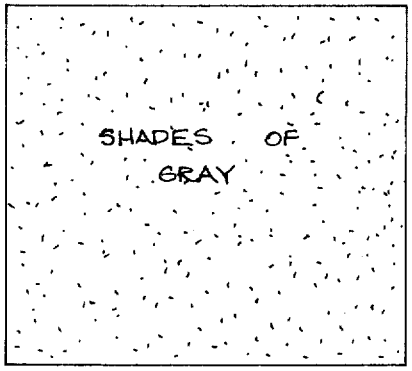
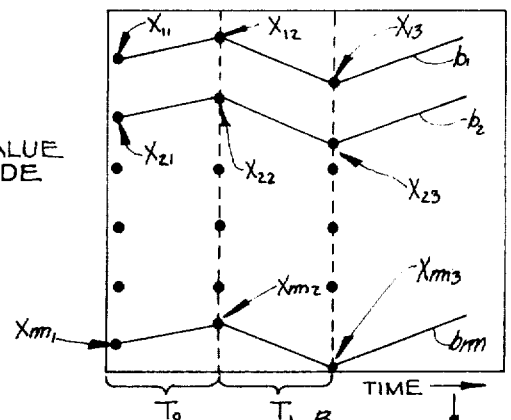
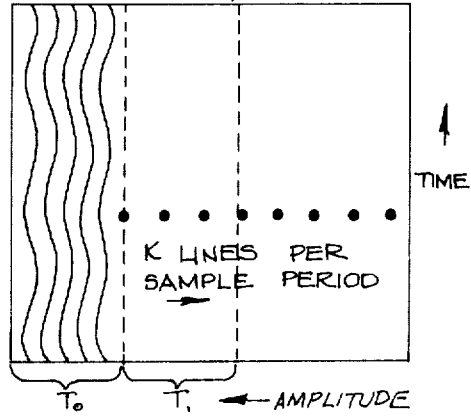

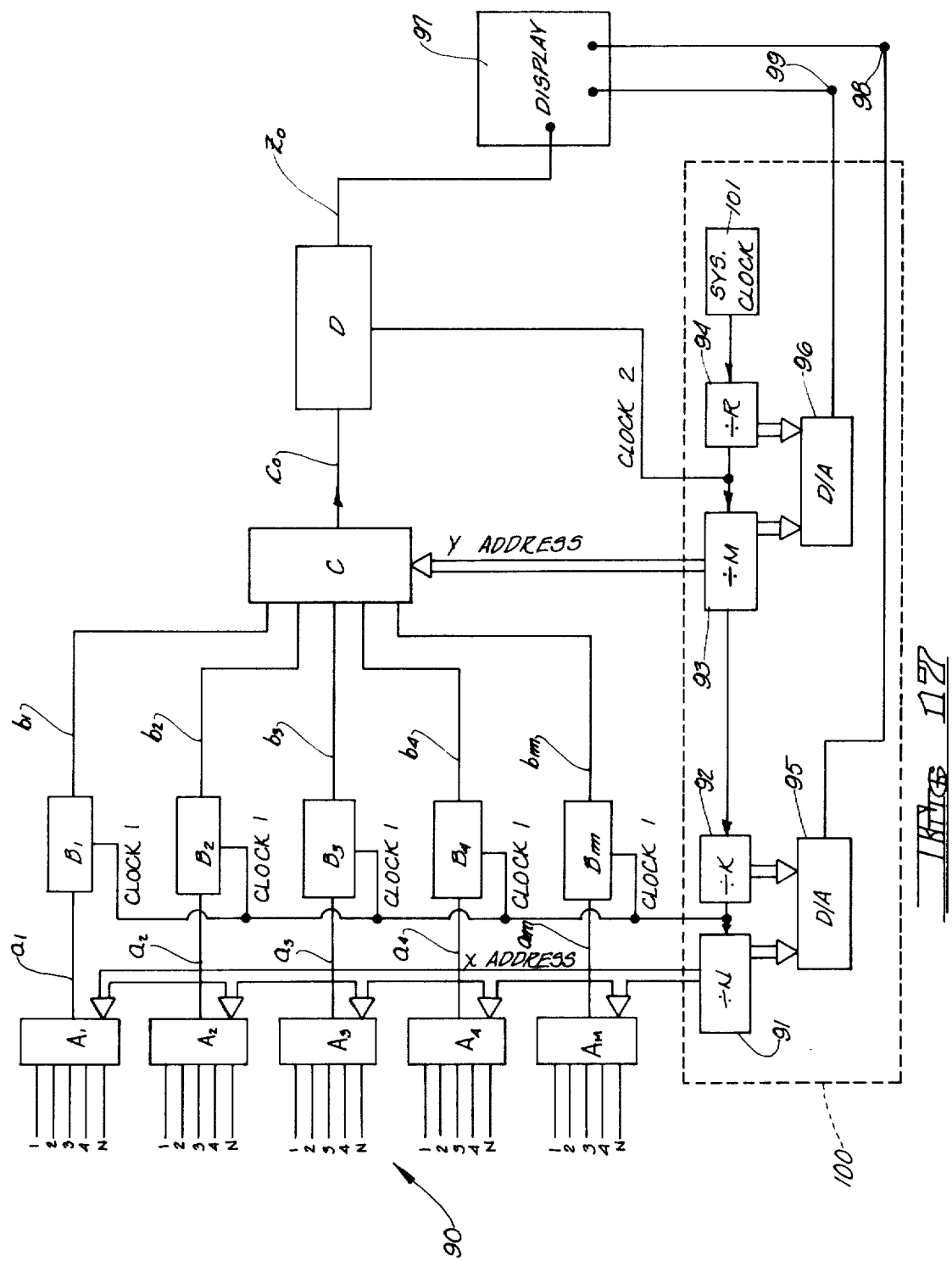

RECURSIVE INTERPOLATION

BACKGROUND OF THE INVENTION

The apparatus of the present invention relates generally to the production of graphical displays representative of the interpolated status of data source arrays. More specifically, the present invention relates to methods and apparatus for producing a continuously interpolated graphical display representing the status of a transducer array in spatial equivalence thereto.

Arrays of discrete date sources, i.e., transducers, are often used to monitor the spatial variations of a critical parameter. For example, it is often desirable to continuously monitor the temperature distribution of a face of a continuous casting mold. In order to monitor this temperature distribution, an array of thermocouples are strategically positioned along the mold face and their outputs monitored. This approach, of course, requires equipment and personnel to monitor the output of each individual thermocouple. Furthermore, the output of the individual thermocouples provide no information reflecting temperature conditions intermediate the individual thermocouples.

By the method and apparatus of the present invention a single graphical display representing the temperature distribution of a mold face is realized. In addition, the graphical display includes information reflecting the temperature distribution for locations intermediate the discretely located thermocouples.

The prior art teaches various devices whose general purpose is that of obtaining a graphic display from a plurality of intermittently sampled data signals. However, the graphic displays formulated by prior art methods have generally been limited to a series of discrete dots representing the values of the data sensors only. That is, for the most part, prior art teachings do not include means for obtaining information regarding positions intermediate the discrete sensor locations. And, although some prior art apparatus teaches the general concept of interconnecting the discrete data points with straight lines, this has generally been accomplished without attempting to derive any meaningful information respecting the positions intermediate the discrete data sensors.

The relatively few prior art devices which attempt to provide a meaningfully interpolated graphical output representing a data sensor array have involved the use of extremely complex equipment, generally including rather sophisticated computer programs. Complex devices of this type have proven unsatisfactory from both a cost and logistical standpoint.

Furthermore, the prior art methods have generally been limited to presenting graphical displays for a one-dimensional data sensor array only. As such, prior art methods of graphically displaying the condition of a two-dimensional data sensor array consists of simply repeating the one-dimensional process a sufficient number of times.

SUMMARY OF THE INVENTION

Accordingly, it is an object of the present invention to provide an improved method and apparatus for producing a graphic display from intermittently sampled data sources, which method and apparatus yield a continuous and clearly readable display spatially equivalent to the status of the data source array.

A further object of the present invention is to provide a graphic display from intermittently sampled data which includes meaningfully interpolated results respecting locations intermediate data sensors. It is still a further object of the present invention to provide a graphic display from a plurality of intermittently sampled data signals arranged in a two-dimensional array wherein meaningful interpolations are accomplished with respect to both axes of the array.

More specifically, it is an object of the present invention to provide an improved method and apparatus for producing a graphic display of the temperature distribution on a continuous casting mold face from temperature data acquired by intermittently sampling a two-dimensional array of thermocouples located in proximity to the mold face. Another object of the present invention is to provide a meaningful and continuously interpolated displaywhich presents, in spatial equivalence, an output representative of the temperature distribution of the mold face.

In accordance with the present invention data signals from a one-dimensional transducer array are multiplexed and successively made available to the input of a tandem of sample and hold circuits. The tandem of sample and hold circuits is configured so as to form an analog shift register such that the input for each sample and hold circuit succeeding the input sample and hold circuit is taken from the output of the immediately preceding sample and hold circuit. A control circuit establishes the sampling rate of the sample and hold tandem in a repetitive fashion such that, during each sample period, the last sample and hold circuit in the tandem is updated firstly, consecutively followed by the remaining sample and hold circuits in turn. The updating procedure of the sample and hold tandem occurs once for every sample period as determined by the sample rate.

Data from the sample and hold tandem is applied, in parallel format, to a computation unit. The computation unit, utilizing the applied data and time, after a predetermined time delay and, during each subsequent sample period, recursively provides a continuous output signal interpolatively representing the values of each spatially adjacent pair of data sources. Due to the continual updating of the sample and hold tandem, a continuous signal representing the interpolated values of the one dimensional transducer array is produced.

The particular interpolation scheme utilized is implemented by the computation unit. In some situations a linear interpolation may be considered appropriate, in which case the computation unit would be configured so as to implement a linear scheme. Furthermore, in the case of a linear scheme, two individual sample and hold circuits would comprise the sample and hold tandem. Should the computation unit be rearranged so as to implement a non-linear scheme the number of sample and hold circuits in the tandem would be accordingly increased. For example, in the case of implementation by a computation unit representing a third degree equation, four sample and hold circuits would be utilized.

The basic one-dimensional recursive interpolation scheme may also be utilized in a dual re-iterative manner so as to provide a graphical display of the status of a two-dimensional transducer array. That is, by causing a single one-dimensional interpolator to scan, at a relatively rapid rate, the interpolated outputs of a series of slower one-dimensional interpolators, a graphical outut can be obtained of the two-dimensional transducer array which includes interpolative information in the direction of both axes of the array.

BRIEF DESCRIPTION OF THE DRAWINGS

FIG. 1 is a general block diagram of one embodiment of the one-dimensional recursive interpolator of the present invention.

FIG. 2 is a diagrammatic representation of a one-dimensional transducer array showing the output signal levels of the individual transducers.

FIG. 3 is a detailed block diagram showing a linear embodiment of the one-dimensional recursive interpolator of the present invention.

FIG. 4 is a timing diagram for the interpolator embodiment of FIG. 3.

FIG. 5 is a graphical representation of various signals associated with the interpolator embodiment of FIG. 3.

FIG. 6 is a block diagram including a modification to the interpolator embodiment of FIG. 3.

FIG. 7 is a graphical representation of the output of the modified interpolator embodiment of FIG. 6.

FIG. 8 is a block diagram showing another linear embodiment of the one-dimensional recursive interpolator of the present invention.

FIG. 9 is a block diagram showing the interpolator embodiment of FIG. 3 being utilized in association with a single time varying transducer.

FIG. 10 is a diagrammatic representation of another one-dimensional transducer array showing the output signal levels of the individual transducers.

FIG. 11 is a block diagram showing a non-linear third degree embodiment of the one-dimensional recursive interpolator of the present invention.

FIG. 12 is a schematic diagram of the computation unit of the interpolator embodiment of FIG. 11.

FIG. 16 is a diagrammatical representation of a two-dimensional N × M transducer array.

FIG. 17 is a block diagram showing an embodiment of the two-dimensional recursive interpolator of the present invention.

FIG. 18 are four graphical representations associated with the interpolator embodiment of FIG. 17.

DESCRIPTION OF THE PREFERRED EMBODIMENTS

Figures 13, 14, 15:
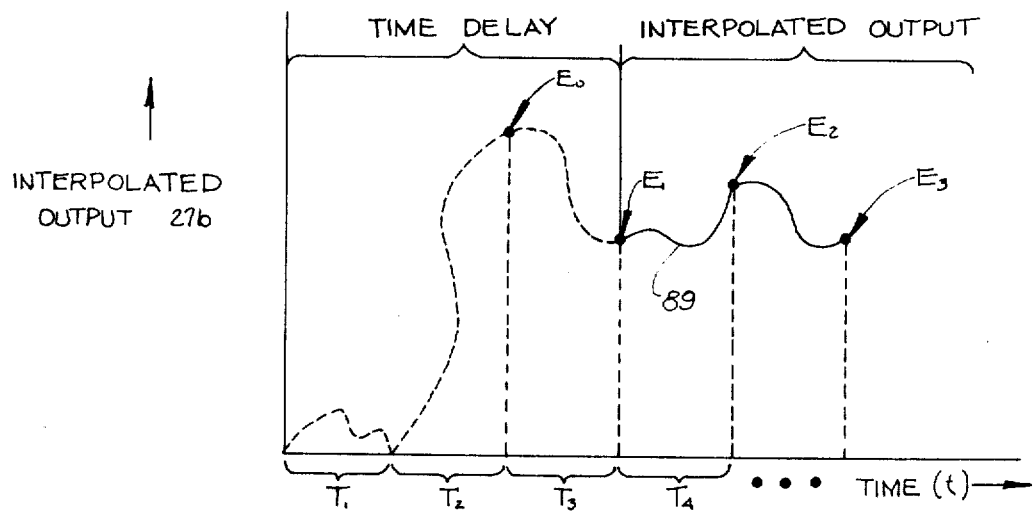
FIG. 13 is a table illustrating various signal levels associated with the computation unit of FIG. 12.
FIG. 14 is a table illustrating various periodic states of the sample and hold circuits associated with the interpolator embodiment of FIG. 11.
FIG. 15 is a graphical representation of the output of the interpolator embodiment of FIG. 11.

Referring now to the drawings and, particularly to FIG. 1, there is shown a general block diagram of the one-dimensional recursive interpolator of the present invention. A plurality of sample and hold circuits, indicated generally as at 2, 4, 6, 8 and 10, are arranged in tandem so as to form an analog shift register. As indicated by interconnections 3, 5, 7 and 9, the output of each sample and hold circuit is applied to the input of its immediately succeeding sample and hold circuit. Data from the sample and hold tandem 2, 4, 6, 8 and 10 is applied to a computation unit 11 in a parallel manner by respectively, data lines 12, 13, 14, 15 and 16. A control assembly comprising a system clock 17, such as clock oscillator model XO-14 manufactured by Electronics Division of Bulova Watch Company, Inc., and a timing control circuit 18 establishes the sampling rates of sample and hold circuits 2, 4, 6, 8 and 10 by repetitively pulsing, respectively, update lines 19, 20, 21, 22 and 23 communicating therewith. In addition, timing control circuit 18 causes the computation unit 11 to repetitively reset by commands transmitted thereto along reset line 24. The discrete input data is applied to the recursive interpolator along input line 25 communicating with sample and hold circuit 2 and the interpolated output is applied to a display means 26, such as a conventional oscilloscope, by the output line 27. The timing control circuit 18 drives the horizontal deflection input 28 of the display 26 by means of a deflection signal over line 29 such that the display 26 is caused to horizontally sweep at a rate proportional to the sampling rates of the sample and hold circuits 2, 4, 6, 8 and 10. Of course, the interpolated output from the computation unit 11 is applied by output line 27 to the vertical deflection input 30 of the display 26.

As indicated above, FIG. 1 is a general block diagram representing the basic one-dimensional interpolator of the present invention. Accordingly, a specific embodiment of the interpolator of the present invention may include a definite number of sample and hold circuits along with an appropriately configured computation unit. For example, a linear computation unit 11 can be utilized in conjunction with two sample and hold circuits to provide linear interpolation. Similarly, a non-linear computation unit 11 can be utilized in conjunction with four sample and hold circuits to provide third degree non-linear interpolation.

It has been found that adapting the recursive interpolator of FIG. 1 to perform linear interpolation is especially useful. Accordingly, FIG. 2 shows a one-dimensional transducer array 31 comprising five spatially oriented transducers 32, 33, 34, 35 and 36 occuring in a consecutive progression. $E_0$, $E_1$, $E_2$, $E_3$ and $E_4$ respectively represent the successive magnitudes of the output voltages of the transducers. The linear interpolator shown in FIG. 3 can be utilized to provide an interpolated continuous output reflecting the data distribution monitored by the transducers 32, 33, 34, 35 and 36.

As noted in FIG. 3, wherein like parts have been identified by corresponding numerals, the linear recursive interpolator comprises a computation unit 11a, two sample and hold circuits 8a and 10a, a system clock 17a, a timing control circuit 18a, input line 25a, output line 27a, reset line 24a and update lines 22a and 23a. The display 26a has a vertical deflection input 28a coupled to the computation until 11a by output line 27a and a horizontal deflection input 30a connected to the timing control circuit 18a by line 29a. The computation unit 11a comprises a difference amplifier 37, a summing amplifier 38 and an integrator 39.

Operation of the one-dimensional linear recursive interpolator shown in FIG. 3 is conveniently illustrated with reference to the timing diagram shown in FIG. 4 and the various graphical outputs shown in the diagram of FIG. 5. To initiate the interpolation process, the system clock 17a applies a clock pulse 40 along line 41 to the timing control circuit 18a. In turn, the timing control circuit 18a applies a gate address signal along line 42 to the multiplexer 43 gating the output of the first transducer 32 of the transducer array 31 to input line 25a. Multiplexer 43 as well as the various other multiplexers discussed herein may be of the type identified by Datel Systems, Inc., Model MM16. Substantially simultaneously with the occurrence of clock pulse 40 the timing control circuit 18a develops and applies pulse 44 along update line 23a to sample and hold circuit 10a causing it to sample and store the current output of sample and hold circuit 8a by means of interconnection 45 communicating therebetween. Thereafter, the timing control circuit 18a applies a pulse 46 to sample and hold circuit 8a along update line 22a causing the latter to sample and store the current data value available along input line 25a from multiplexer 43. Therefor, since sample and hold circuit 10a accomplishes its sample slightly before sample and hold circuit 8a and, if the initial value stored in sample and hold circuit 8a is zero (0), sample and hold circuit 10a will store a value of zero during the first sample period which is defined as the time between occurrences of clock pulses 40 and identified in FIG. 4 by T. Also, since sample and hold circuit 8a samples the output of multiplexer 43 after the sampling by sample and hold circuit 10a, its stored value during the first sample period will consist of the gated output of transducer 32, which is represented by the data value $E_0$.

It can thusly be seen that during the first sample period, i.e. $T_0$ as shown in FIG. 5, a data value having a magnitude of $E_0$ is being applied to the positive input terminal 46 of the difference amplifier 37 while a data value having zero magnitude is being applied to the negative input terminal 47 thereof. The output of the difference amplifier 37, during the first sample period $T_0$, is constant at the value of $E_0$ as shown by curve 48 in FIG. 5. The constant difference data value $E_0$ is then applied over line 49 to integrator 39, which has been set to zero by the timing control circuit 18a via pulse 50 (See FIG. 4) along reset line 24a. If the gain of the integrator 39 is adjusted so that it equals the reciprocal of the sample period (i.e. 1/T) the output 51 of integrator 39 during the first sample period $T_0$, will be a ramp function extending from zero to $E_0$ as shown by curve 52 of FIG. 5. The summing amplifier 38 adds the values applied to it by lines 51 and 53, respectively, the outputs of the integrator 39 and the sample and hold circuit 10a, to provide the interpolated output 54 during the first sample period to as shown in FIG. 5.

During the second sample period $T_1$ a similar process occurs. The system clock initiates clock pulse 40a whereupon the timing control circuit 18a causes multiplexer 43 to gate the output of the next consecutive transducer 33 of the transducer array 31 to input line 25a. Sample and hold circuit 10a is caused to update by pulse 44a transmitted thereto along update line 23a to the current value of sample and hold circuit 8a ($E_0$) and sample and hold circuit 8a is then caused to update by pulse 46a transmitted thereto along update line 22a to the current value available along input line 25a ($E_1$). Also, at the initiation of sample period $T_1$, the integrator 39 is reset to zero by means of pulse 50a along reset line 24a. The output 49 of the difference amplifier 37 is now the value of $E_1$ minus $E_0$, see curve 48a of FIG. 5, the output 51 of the integrator 39 is a ramp function, initialized at zero, reflecting this difference, see curve 52a of FIG. 5, and the output 27a of summing amplifier 38, see curve 54a of FIG. 5, adds the value of $E_0$ to the ramp. Note that during each sample period the integrator 39 is reset to zero so that each ramp function initiates at a zero level. A similar process is repeated during each subsequent sample period resulting in a repetitive interpolated output as depicted by the curve 54 through 54d in FIG. 5. It will be understood, of course, that the various sample periods may be of different duration.

As clearly shown in FIG. 5, the output 27a, which is represented by the curve 54 through 54d, is a linear interpolation, delayed by one sample period, of the transducer array 31 consisting of transducers 32, 33, 34, 35, and 36. The output 27a therefor, graphically represents, in spatial equivalency, the interpolated data distribution of the repetitively and successively sampled transducer array 31. Furthermore, since each repetitive interpolation (i.e. the inter-connection of each spatially adjacent pair of transducer data values) is an independent operation, due to repetitively initializing the integrator 39 to a zero level, and not dependent upon any prior or subsequent interpolations, the output 27a is a recursively interpolated output.

Finally, since the timing control circuit 18a drives the horizontal deflection input 30a of the display 26a synchronously with its gating of the multiplexer 43 and, since the repetitively interpolated output 27a of the computation unit 11a drives the vertical deflecton input 28a of the display 26a, the display 26a will exhibit a graphical continuous output accurately reflecting, in spatial equivalency, the data values ($E_0$, $E_1$, $E_2$, $E_3$ and $E_4$) of the transducer array 31 and will include linearly interpolated data values intermediate each adjacent pair of individual transducers.

It can be see that since each repetitive integration is initialized at zero and, since the integrator output is scaled by the reciprocal of the sample period (1/T) the one-dimensional linear recursive interpolator described above repetitively implements the following function:

$$b(t) = E_{N-1} + \frac{1}{T}(E_N - E_{N-1})t. \qquad (1)$$

where, time ($t$) repetitively varies between 0 and T, and, $b(t)$ = the interpolated output between and including the data values of any two adjacent transducers.

Accordingly, the interpolated output reflecting the data values of transducers 32 and 33 of FIG. 2 can be written as follows:

$$b(t) = E_0 + \frac{1}{T}(E_1 - E_0)t. \qquad (2)$$

where, $0 \leq t \leq T$.

In order to insure that the output 27a (see curves 54 through 54d in FIG. 5) of the one-dimensional linear interpolator of FIG. 3 consists of a series of connected straight line segments, the total update time of the sample and hold circuits 8a and 10a, as determined by the pulse width of pulses 44 and 46, must be small compared to the sample period T. Furthermore, in order to remove switching transients from the output signal line 27a caused by the switching of sample and hold circuits 8a and 10a in response to respectively pulses 46 and 44, circuitry to remove switching transients can be provided as shown in FIG. 6. This circuitry consists of a track and hold circuit 55 controlled by signals along line 56 from the timing control circuit 18a. Removal of transients is accomplished by holding the output 57 of the computation unit 11a at its previous value during the updating time for sample and hold circuits 8a and 10a, respectively the pulse widths of pulses 46 and 44, by means of degliching pulse 58. As will be readily understood, while the level of the degliching pulse 58 is high, the output 59 of the track and hold circuit 55 follows its input 57; when the level of the degliching pulse 58 is low, the output 59 of the track and hold circuit 55 is held at the current value of its input 57. Datel Systems, Inc. Model SHM-2, which is operationally consistent with the foregoing switchology, may conveniently be used for track and hold circuit 55. Although switching transients are thereby removed from the output signal line 59, small distortions are produced in the interpolated output 59 as noted by the flat line segments 60 through 60d in the output curve 61 of FIG. 7 which graphically represents the interpolated output 59.

In order to eliminate the one sample period time delay in the interpolated output 27a of the circuit configuration of FIG. 3 a further modification as shown in FIG. 8 may be utilized. The reason for the time delay of one sample period in the circuit of FIG. 3 is that it takes one sample period before sample and hold circuit 10a is updated to the initial transducer 32 value of $E_0$. To eliminate this delay, the FIG. 8 circuit configuration utilizes multiplexers 62 and 63 in place of multiplexer 43 and sample and hold circuits 8a and 10a of FIG. 3. The gating of multiplexers 62 and 63 by gate address signals from the timing control circuit 18a along, respectively lines 64 and 65, is synchronized such that multiplexers 62 and 63 will repetitively gate successive transducer values to their respective outputs 66 and 67 at an equivalent rate and with the gating of multiplexer 63 being unitarily shifted with respect to that of multiplexer 64. That is, when multiplexer 62 is gating the data value of transducer 32 to its output 66, multiplexer 63 will simultaneously be gating the data value of transducer 33 to its output 67; during the next sample period multiplexer 62 will be gating the data value of transducer 33 to its output 66 while multiplexer 63 will be simultaneously gating the data value of transducer 34 to its output 67; and so on. As thus seen, data is supplied to the computation unit 11 in a manner similar to that in the FIG. 3 circuit configuration but without the attendant time delay. The interpolated output 27a of the FIG. 8 circuit configuration consequently does not exhibit the one sample period time delay characteristic of the circuitry shown in FIG. 3.

Although operation of the recursive interpolator of the present invention has been described with respect to a spatial array of a transducers 31, it is readily apparent that it is likewise applicable to a single time varying transducer. Accordingly, FIG. 9 shows a linear interpolator corresponding to the interpolator of FIG. 3 except that the spatial transducer array 31 and the multiplexer 43 have been replaced by a single time varying transducer 68. Sample and hold circuit 8a will intermittently sample the output of time varying transducer 68 in a manner similar to its sampling of the output of multiplexer 43 and thereby provide an output 27a representing the time interpolated condition of transducer 68.

The one-dimensional interpolation scheme described above should be utilized where it is anticipated that a linear relationship exists between the values of adjacent discrete transducer data values. However, since situations may arise wherein a non-linear relationship is expected, the general interpolation system as shown in FIG. 1 may be modified to accomodate a non-linear interpolation scheme. For example, it has been found that in many situations it is desirable to provide an interpolated output which represents a thrid degree equation. Accordingly, an adaptation of the general interpolator of FIG. 1 capable of accomplishing third degree non-linear interpolation is discussed in detail below.

There are various well known mathematical schemes which can be implemented to accomplish third degree non-linear interpolation. Two common methods are Legrange's scheme and Newton's scheme. However, both of these schemes, as well as any other known scheme, present considerable deficiencies with respect to hardware implementation. For example, the use of Legrange's scheme introduces poor accuracy into the output because of the hardware inaccuracy of the numerous multipliers required and Newton's scheme presents timing difficulties since the integrators are reset to a value other than zero. In order to overcome these difficulties and deficiencies in hardware implementation a novel third degree interpolation scheme has been developed.

Consider the four discrete transducer values $E_0$ through $E_3$ shown in FIG. 10 which represent the first four transducer values of a one-dimensional transducer array such as shown at 69 in FIG. 11. As previously discussed, a linear interpolation between values $E_1$ and $E_2$ can be accomplished by hardware implementing the following equation:

$$b(t) = E_1 + \frac{1}{T}(E_2 - E_1)t. \qquad (3)$$

where, $0 \leq t \leq T$. Since the interpolated values immediately preceding $E_1$ and immediately subsequent to $E_3$ may effect the interpolation between $E_1$ and $E_2$, the slopes $E_{10} = E_1 - E_0$ and $E_{32} = E_3 - E_2$ would similarly effect the interpolation between $E_1$ and $E_2$. Furthermore, clearly $E_{10}$ should effect the interpolation between $E_1$ and $E_2$ for values of $t$ close to zero (i.e., the time occurrence of $E_1$) more than should $E_{32}$. Conversely, $E_{32}$ should have the greater effect for $t$ close to T (i.e., the time occurrence of $E_2$). And, the two slopes should have the same weight for $t = T/2$. Finally, any terms added to the basic linear scheme [i.e., equation (3)] must vanish at $t = 0$ and $t = T$ since the output curve must pass through the values $E_1$ and $E_2$. A novel equation which satisfies these constraints is:

$$b(t) = E_1 + \frac{1}{T}(E_2 - E_1)t + a_0\left[E_{10}\left(1 - \frac{t}{T}\right) + E_{32}\frac{t}{T}\right]\frac{t}{T}\left(1 - \frac{t}{T}\right). \qquad (4)$$

where;
 $E_{10} = E_1 - E_0$;
 $E_{32} = E_3 - E_2$;
 $a_0$ is a constant; and
 $0 \leq t \leq T$.

As will be noted, the first two terms of the novel equation (4) constitute the linear term of equation (3) and the remaining term represents a correction term accounting for the effects of slopes $E_{10}$ and $E_{32}$. Rearranging the terms of equation (4) yields the hardware form of the equation as follows:

$$b(t) = E_1 + (E_{21} - a_0 E_{10}) \frac{t}{T} + a_0 (E_{32} - 2E_{10}) \left(\frac{t}{T}\right)^2 + a_0 (E_{10} - E_{32}) \left(\frac{t}{T}\right)^3. \quad (5)$$

where, $E_{21} = E_2 - E_1$.

It is readily apparent that equation (5) will interpolate between $E_1$ and $E_2$ by means of a curve of the third degree. By repetitively reaccomplishing equation (5) for all adjacent transducer pairs in the transducer array, a third degree interpolated output representing the transducer array, in spatial equivalency, results.

Since each independent interpolation in the novel third degree scheme utilizes data values from four successive transducers, the hardward implementation of the scheme may incorporate four sample and hold circuits. Accordingly, FIG. 11, which shows an interpolator circuit for implementing the novel third degree interpolation scheme, includes four sample and hold circuits $4b$, $6b$, $8b$ and $10b$. Except for the computation unit $11b$, the remaining circuitry is similar to that shown in FIG. 3. Of course, additional interconnections are required to accomodate the two additional sample and hold circuits $4b$ and $6b$. These additional interconnections include lines $13b$, $14b$, $20b$ and $21b$.

The hardware of the computation unit $11b$ necessary to implement the third degree scheme of equation (5) is shown in FIG. 12. As shown, the computation unit $11b$ consists of difference amplifiers 70, 71, 72, 73, 74 and 75 and integrators 76, 77 and 78. Also included are associated scaling resistors for each difference amplifier and for each integrator. Since the operation of the various difference amplifiers are substantially identical, the operating characteristics of difference amplifier 70 will be explained as representative thereof. Initially, after the sample and hold circuits $4b$, $6b$, $8b$ and $10b$ have been updated, respectively, to the values $E_3$, $E_2$, $E_1$ and $E_0$, it will be noted that voltage $E_1$ is applied over data line $15b$ to the positive input terminal 79 of difference amplifier 70 through the voltage divider consisting of resistors $R_n$ and $R_g$. Therefore, the voltage at the positive input terminal 79 of difference amplifier 70 is $E_1 R_g / (R_n + R_g)$. And, the non-inverted output voltage at node 80 of difference amplifier 70, taking into account the scaling effect of feedback resistor $R_f$ and the input resistor $R_p$, is as follows:

$$e = E_1 \left(\frac{R_g}{R_n + R_g}\right)\left(1 + \frac{R_f}{R_p}\right) - E_0 \left(\frac{R_f}{R_p}\right)$$

Since the values of $R_g$, $R_n$, $R_p$ and $R_f$ are all equal to $R_0$, the output at node 80 would reduce to $E_1 - E_0$. The output of the integrators 76, 77, and 78 are summated integrations of the inputs thereto scaled by the reciprocal of the constant multiplier of the input resistors $R_1$. The voltages at nodes 81 through 88 are shown in the Table of FIG. 13 wherein it is apparent that the voltage at output node 88 implements the novel non-linear third degree equation (5).

The operation of the non-linear third degree recursive interpolator of FIG. 11 can be conveniently explained with reference to Table 2 of FIG. 14 and the graph of FIG. 15. It will be noted that during the first sample period $T_1$ the stored value of sample and hold circuit $4b$ is $E_0$ while the remaining sample and hold circuits are at a zero level. Therefore, the only input to the computation unit $11b$ form the sample and hold tandem during the first sample period $T_1$ will be along the line $13b$ from sample and hold circuit $4b$. Similarly, during the second sample period $T_2$ sample and hold circuits $4b$ and $6b$ will apply respectively, data values $E_1$ and $E_2$ along respectively, lines $13b$ and $14b$ to the computation unit $11b$; during the third sample period $T_3$ sample and hold circuits $4b$, $6b$ and $8b$ will apply respectively, data values $E_2$, $E_1$ and $E_0$ along respectively lines $13b$, $14b$ and $15b$ to the computation unit $11b$; and, during the fourth sample period $T_4$ sample and hold circuits $4b$, $6b$, $8b$ and $10b$ will apply respectively, data values $E_3$, $E_2$, $E_1$ and $E_0$ along respectively, lines $13b$, $14b$, $15b$ and $16b$ to the computation unit $11b$.

Since the computation unit $11b$ repetitively interpolates between the middle two data values of the four data values repetitively applied thereto (e.g., during sample period $T_4$ the computation unit $11b$ will interpolate between data values $E_1$ and $E_2$), a distorted output, not reflecting an accurate interpolation, will result during the first three sample periods $T_1$, $T_2$ and $T_3$. However, beginning with sample period $T_4$, four appropriate values are applied to the computation unit $11b$ by the sample and hold tandem resulting in a true interpolated output. Therefore, in the third degree non-linear scheme shown in FIG. 11, a time delay of three sample periods is introduced before the interpolated output is achieved. Curve 89 of FIG. 15 accordingly shows the third degree recursively interpolated output resulting from the implementation by the computation unit $11b$ of the novel third degree equation (5).

The value of $a_0$ introduced into equation (4) and (5) and into the scaling resistors of integrator 76 may be chosen to obtain an output third degree curve 89 with the desired degree of inflection. It has been found that an $a_0$ of ½ results in an interpolation scheme closely corresponding to the Newton scheme and therefor has been used in the computation unit $11b$ and in calculating the voltages in Table 1 of FIG. 13.

The timing sequence of the non-linear interpolator of FIG. 11 is substantially equivalent to the timing of the linear interpolator of FIG. 3. Accordingly, the timing control circuit $18b$ causes sample and hold circuit $10b$ to sample and be updated first closely followed by sample and hold circuits $8b$, $6b$ and $4b$ in turn. This updating procedure occurs once for every sample period T. Furthermore, as in the case of the linear interpolator of FIG. 3, the timing control circuit $18b$ will reset the integrators 76, 77 and 78 to a zero level at the initiation of each sample period. Also, it will be apparent that a transient removal track and hold circuit similar to the track and hold circuit 55 discussed with reference to the linear interpolator can likewise be utilized in the output line $27b$ of the non-linear interpolator.

It will be obvious to one skilled in the art that the general recursive interpolation scheme discussed above can be easily adapted to provide interpolated outputs reflecting curves of various degrees. Such can be accomplished by utilizing an appropriate number of sample and hold circuits or, alternatively, an appropriate multiple multiplexer shifting configuration as described herein, in conjunction with a corresponding computation unit. Therefore, depending upon the specific application, curves of a higher order than 3 may be obtained although, a correspondingly larger time delay will be introduced into the output signal. The time delay could, however, be eliminated by using a multiple multiplexer configuration as previously described herein.

In numerous applications transducers are found to exist in two-dimensional arrays rather than one-dimensional arrays. The general one-dimensional interpolator described above can be conveniently adapted to drive an output display corresponding to the spatially interpolated data value distribution of a two-dimensional array of discrete transducers.

Consider, for example, the two-dimensional array of M rows of N corresponding transducers each shown in FIG. 16. The two dimensional N × M array of transducers 90, such as thermocouples from which information is to be gathered and displayed in a realtime manner, will comprise the input to the two-dimentional interpolator. One rather obvious method for providing an interpolated output reflecting a two-dimensional array such as 90 is to utilize a series of M independent one-dimensional interpolators, as described above, each of which would independently provide a one-dimensionally interpolated output corresponding to one row of transducers of the transducer array 90. Although the utilization of a series of independent one-dimensional interpolators to provide an output for a two-dimensional transducer array is certainly feasible, it possesses one serious deficiency; namely, although interpolated information is extracted reflecting data values between the columns of each individual transducer rows, no interpolated information reflecting data values between transducer rows is provided.

Accordingly, shown in FIG. 17 is a novel combination of the one-dimensional recursive interpolators previously described herein which is adapted to provide interpolated information reflecting data values in the direction of both axes of a two-dimensional transducer array such as generally shown at 90 in FIG. 16.

As will be noted from FIG. 17, the outputs of each individual row of N transducers each is applied to the input of a plurality of multiplexers $A_1$ through $A_M$. The multiplexers $A_1$ through $A_M$ are simultaneously provided with identical X address gate signals from the frequency divider 91 of the control unit 100 so that they all scan their corresponding transducer row synchronously. The outputs $a_1$ through $a_M$ of the multiplexers $A_1$ through $A_M$, which can be considered to comprise a plurality of data sets each of which is identical to the input to the one-dimensional interpolators previously described, are then applied to a series of one-dimensional interpolators $B_1$ through $B_M$ respectively which, in turn, generate a series of M independent one-dimensional interpolations $b_1$ through $b_M$ as shown in FIG. 17 and in the graph 18 B of FIG. 18. Since the one-dimensional interpolators $B_1$ through $B_M$ can be substantially identical to the interpolators previously described herein, the M outputs of the $B_1$ through $B_M$ one-dimensional interpolators are continuous analog functions corresponding to the one-dimensional spatial interpolations of the M one-dimentional arrays of N transducers each (i.e. of the M rows of N transducers each). A clock signal (clock 1) from the frequency divider 92 of the control unit 100 causes the one-dimensional interpolators $B_1$ through $B_M$ to operate synchrouously (i.e., to update and reset integrators simultaneously) and at a rate equivalent to the gating of multiplexers $A_1$ through $A_M$.

It will next be noted that the $b_1$ through $b_M$ outputs from the $B_1$ through $B_M$ one-dimensional interpolators are applied to an M channel multiplexer C. The multiplexer C is caused to scan the $b_1$ through $b_M$ analog signals by Y address gate signals from frequency divider 93 such that a plurality of scans are accomplished before frequency divider 91 causes the X address to multiplexers $A_1$ through $A_M$ to be incremented. In other words, during any one sample period, such as $T_o$ in graphs 18B and 18C of FIG. 18, multiplexer C will accomplish a plurality of Y vertical scans during each X horizontal increment. The plurality of Y scans per X increment are applied by the multiplexer C to a one-dimensional interpolator D via the connection line $c_0$. The one-dimensional interpolator D can again be substantially identical to the one-dimensional interpolators previously described herein. The operating rate of the one-dimensional interpolator D is sychronized with the scan rate of the multiplexer C by means of the clock 2 input from the frequency divider 94 of the control unit 100. The output $Z_0$ of the one-dimensional interpolator D is consequently a vertical interpolation of the horizontal interpolations of the one-dimensional interpolators $B_1$ through $B_M$ as shown in graph 18C of FIG. 18. The series of vertical amplitude interpolations shown in graph 18C can subsequently be utilized to intensity modulate a CRT display 97 as is generally shown by graph 18D of FIG. 18. The X and Y deflection means of the CRT 97 are controlled synchronously with transducer scanning by means of X and Y deflection signals 98 and 99 from respectively digital to analog convertors 95 and 96 thereby assuring that the display corresponds spacially to the discrete transducer array 90. The intensity modulated CRT thereby provides a realtime two-dimensional display of a spatial interpolation of the parameter data values monitored by the discrete transducer array 90.

The control unit 100 of the two-dimensional interpolator of FIG. 17 includes four frequency dividers 91, 92, 93 and 94 having, respectively, frequency division factors of N, K, M and R where N equals the number of transducers per row and M equals the number of transducers per column of the transducer array 90. Also included in the control unit 100 is a system clock 101 having a frequency represented by F. As previously mentioned, the multiplexer C scanning rate, controlled by Y address gate signals from frequency divider 93, is synchronized with the sample rate of the one-dimentional interpolator D, the latter being controlled by the clock 2 signal from the frequency divider 94. In a similar manner, the scanning rates of multiplexers $A_1$ through $A_M$ (all of which are identical) are synchronized with the sample rates of the one-dimensional interpolators $B_1$ through $B_M$ by means of the X address gate signals from the frequency divider 91 and the clock 1 signal from the frequency divider 92. Furthermore, the scanning rate of multiplexer C is necessarily faster than the operating rate of the one-dimensional interpolators $B_1$ through $B_M$ by a factor of M X K whereby K scans per X address increment will be applied to the one-dimensional interpolater D. Furthermore, due to the presence of the frequency divider 93, clock 2 will have a frequency of M x K times the frequency of clock 1. Accordingly, the one dimensional interpolator D will have a relatively fast operational rate as compared to the one-dimensional interpolators $B_1$ through $B_M$.

The X and Y deflection signals 98 and 99 for the CRT are derived from the digital to analog converters 95 and 96. Digital to analog converter 95 is driven by the X digital address signal from frequency divider 91 and a digital address signal from frequency divider 92 whereas the digital to analog converter 96 is driven by the Y digital address signal from frequency divider 93 and a digital address signal from frequency divider 94. The digital address inputs to the digital to analog converters 95 and 96 from frequency divider 91 and 93 determine the actual range and rate of the X and Y deflection signals respectively. Digital address inputs from frequency divider 92 and 94 are applied to the converters 95 and 96 since more bits are needed to derive the deflection signals 98 and 99 than are needed for the multiplexer gate address signals in order to provide smooth deflection ramps for the CRT 97. In other words, frequency divider 94 will enable the inclusion of $2^R$ steps in each of the $2^M$ steps of the Y deflection signal 99 while the frequency divider 92 will enable the inclusion of $2^K$ steps in each of the $2^N$ steps of the X deflection signal 98.

As thus seen, the frequency divider 92 has two functions: (1) to provide extra bits for smoothing the X deflection ramp 98 and (2) to determine the number of scan lines between actual transducer columns. The frequency divider 94 is solely to furnish additional resolution for the Y deflection ramp 99. Accordingly, the system scans and interpolates the entire transducer field at the rate of F/RMKN frames per second. As will be noted, this two-dimensional interpolation scheme provides an output $Z_0$ reflecting interpolated values between both transducer rows and transducer columns.

It is, of course, understood that the one-dimensional interpolators (D and $B_1$ through $B_m$) utilized in connection with the two-dimensional interpolation scheme as shown in FIG. 17 may be the one-dimensional interpolators discussed previously herein. Accordingly, the one-dimensional interpolators utilized in the two-dimensional interpolation scheme of FIG. 17 may be either linear or non-linear interpolators. Furthermore, the one-dimensional interpolators may include transient removal track and hold circuits and means may be provided to eliminate any time delay associated therewith. For example, any time delay in the output $Z_0$ of the two-dimensional interpolator could be partially eliminated by doubling the number of input multiplexers $A_1$ through $A_M$ and applying a second input directly to each of the one-dimensional interpolators $B_1$ through $B_M$ as previously taught with reference to the one-dimentional linear interpolator.

It will, of course, be understood that the description herein of the preferred embodiments of the invention are intended as exemplary only and not to impose any limitations on the invention.

The embodiments of the invention in which an exclusive property or privilege is claimed are defined as follows:

1. Apparatus for producing, from a plurality of successively occurring discrete date values, a continuous display accurately reflecting said discrete data values and including interpolated data values intermediate each adjacent pair of said discrete data values, said apparatus comprising:
   a. control means for repetitively producing at least first, second and third control signals;
   b. shift means for receiving said first control signal from said control means and having a plurality of outputs and at least one input connected to the source of said successively occurring discrete data values, said shift means, in response to said first control signal, being adapted to repetitively acquire, in shifting progression, a predetermined number of consecutively occurring ones of said succession of discrete data values, each of said repetitive acquistitions defining a sample period wherein the discrete data values acquired each appear at one of said plurality of outputs;
   c. computation means for receiving said second control signal from said control means, said computation means having a plurality of inputs connected for simultaneously receiving in parallel said plurality of outputs from said shift means and producing therefrom, during each of said sample periods, an interpolated segment continuously connecting an adjacently occurring pair of discrete data values acquired by said shift means during the respective sample period wherein, those interpolated segments produced during adjacently occurring sample periods contain a common discrete data value such that said interpolated segments comprise an output signal continuously interconnecting said plurality of discrete data values; and
   d. display means for receiving said output signal from said computation means and said third control signal from said control means and being adapted to develop therefrom said continuous display.

2. Apparatus in accordance with claim 1, wherein said source of discrete data values comprises a one-dimensional array of spatially separated data sources the respective outputs of which comprise said plurality of successively occurring discrete data values.

3. Apparatus in accordance with claim 2, including an input multiplexer having an output connected to said input of said shift means and a plurality of inputs, each of said inputs being connected to one of said discrete data sources comprising said array, said control means being adapted to repetitively produce a fourth control signal, said input multiplexer receiving said fourth control signal from said control means whereby, said output of said input multiplexer comprises said source of discrete data values.

4. Apparatus in accordance with claim 2, wherein said one-dimensional array of data sources comprises a one-dimensional array of transducers in proximity to a monitored condition.

5. Apparatus in accordance with claim 4, wherein said one-dimensional array of transducers comprises a one-dimentional array of thermocouples in proximity to the face of a continuous casting mold.

6. Apparatus in accordance with claim 1, including a time varying data source, the output of said time varying data source being connected to said input of said shift means and comprising said source of successively occurring discrete data values.

7. Apparatus in accordance with claim 1, wherein said control means includes a pulse source for producing a series of clock pulses, the intervals intermediate adjacent ones of said clock pulses comprising a respective series of sample periods, said series of sample periods defining said repetitive operation of said control means.

8. Apparatus in accordance with claim 2, wherein said shift means comprises a plurality of multiplexers equivalent in number to said predetermined number of consecutively occurring discrete data values, each of aid multiplexers having a plurality of inputs, one of said inputs of each of said multiplexers being connected to a respective one of said discrete data sources, each of said multiplexers also having an output, said multiplexer outputs comprising said plurality of outputs of said shift means.

9. Apparatus in accordance with claim 8, wherein said control means includes a pulse source for producing a series of clock pulses, the intervals intermediate adjacent ones of said clock pulses comprising a respective series of sample periods defining said repetitive operation of said control means, said control means also including a timing control circuit for producing said first, second and third repetitive control signals, said first control signal comprising, during each of said sample periods, a plurality of gate address signals, each of said gate address being applied to one of said multiplexers for causing said multiplexers to repetitively gate to said multiplexer outputs said repetitively shifted progression of said pre-determined number of consecutively occurring ones of said succession of discrete data values.

10. Apparatus in accordance with claims 3, wherein said shift means comprises an analog shift register having a tandem of shift elements equivalent in number to said predetermined number of consecutively occurring discrete data values, said tandem of shift elements having an input shift element for receiving said output of said input multiplexer, each of said shift elements having an output, said shift elements outputs comprising said plurality of outputs of said shift means.

11. Apparatus in accordance with claim 10, wherein said analog shift register comprises a tandem of sample and hold circuits each of said sample and hold circuits having its output applied to the sample and hold circuit immediately successive thereof in said tandem.

12. Apparatus in accordance with claim 10, wherein said control means includes a pulse source for producing a series of clock pulses, the intervals intermediate adjacent ones of said clock pulses comprising a respective series of sample periods defining said repetitive operation of said control means, said control means also including a timing control circuit for producing said first, second, third and fourth repetitive control signals, said first control signal comprising, during each of said sample periods, a plurality of update signals, each of said update signals being applied to a respective one of said shift elements for causing, during each of said sample periods, said tandem of shift elements to successively update concluding with said input shift element, said fourth control signal thereafter and, during each of said sample periods, causing said input multiplexer to gate to said input shift element, in succession, one of said successively occurring discrete data values.

13. Apparatus in accordance with claim 1, wherein said computation means comprises a linear computation unit for producing a repetitive series of linear interpolated segments, said repetitive series of linear interpolated segments comprising said output signal of said computation means.

14. Apparatus in accordance with claim 13, wherein said control means includes a pulse source for producing a series of clock pulses, the intervals intermediate adjacent ones of said clock pulses comprising a respective series of sample periods defining said repetitive operation of said control means and said shift means includes means wherein each of said repetitively acquired pre-determined number of discrete data values comprises a repetitively acquired first discrete data value and a repetitively acquired second discrete data value, each of said repetitively acquired first discrete data values occurring prior to its respective one of said repetitively acquired second discrete data values.

15. Apparatus in accordance with claim 14, wherein said linear computation unit comprises:
 a. a difference amplifier for, during each of said sample periods, receiving said repetitively acquired first and second discrete data values and developing therefrom an output difference signal representing the value of said repetitively acquired second discrete data value less said repetitively acquired first discrete data value;
 b. integration means connected to said difference amplifier for, during each of said sample periods, receiving said output difference signal and developing therefrom an output ramp signal representative of the integrated value of said output difference signal scaled by the reciprocal of the current sample period, each of said repetitive integrations having a lower limit of zero and an upper limit equivalent to the value of said current sample period; and
 c. a summing amplifier connected to said integration means for, during each of said sample periods, receiving said output ramp signal and said repetitively acquired first discrete data value and developing therefrom a linear output summation signal representative of the value of said output ramp signal added to said repetitively acquired first discrete data value, each of said linear output summation signals comprising a respective one of said repetitive series of recursively interpolated signals.

16. Apparatus in accordance with claim 15, wherein said timing control circuit applies said repetitive second control signal to said integration means for, at the initiation of each of said sample periods, causing said output ramp signal to reset to zero.

17. Apparatus in accordance with claim 1, wherein said computation means comprises a non-linear computation unit for producing a repetitive series of non-linear interpolated segments, said repetitive series of non-linear interpolated segments comprising said output signal of said computation means.

18. Apparatus in accordance with claim 1, wherein said computation means comprises a third degree non-linear computation unit for producing a repetitive series of third degree non-linear interpolated segments, said repetitive series of third degree non-linear interpolated segments comprising said output signal of said computation means, said control means including a pulse source for producing a series of clock pulses, the intervals intermediate adjacent ones of said clock pulses comprising a respective series of sample periods defining said repetitive operation of said control means and said shift means including means wherein each of said repetitively acquired pre-determined number of discrete data values comprises, occuring in respective order during each of said sample periods, repetitively acquired first, second, third and fourth discrete data values.

19. Apparatus in accordance with claim 18, wherein said third-degree non-linear computation unit comprises hardware means for implementing, during each of said sample periods, the following operation:

$$B(t) = E_1 + \frac{1}{T} \int_0^T (E_{21} - a_0 E_{10}) \, dt + \frac{a_0}{T^2} \iint_0^T (E_{32} - 2E_{10}) \, dt^2$$

$$+ \frac{a_0}{T^3} \iiint_0^T 6(E_{10} - E_{32}) \, dt^3.$$

where, $E_0$ = said repetitively acquired first occurring discrete data value, $E_1$ = said repetitively acquired second occurring discrete data value, $E_2$ = said repetitively acquired third occurring discrete data value, $E_3$ = said repetitively acquired fourth occurring discrete data value, $E_{10} = E_1 - E_0$;

$E_{21} = E_2 - E_1$;

$E_{32} = E_3 - E_2$;

$T$ = the time duration of each of said sample periods, $a_0$ = a predetermined constant value, and $B(t)$ comprises said series of third degree non-linear recursively interpolated signals.

20. Apparatus in accordance with claim 1, wherein said display means includes an amplitude vertical input and a time base horizontal input, said output signal from said computation means driving said amplitude vertical input and said third control signal from said control means driving said time base horizontal input at a rate proportional to said repetitive operation of said control means.

21. Apparatus for producing, from a plurality of data sets, each of said data sets comprising a plurality of successively occurring discrete data values, a two-dimensionally interpolated display, said apparatus comprising:

a. control means for producing at least first, second, third and fourth output control signals;

b. a plurality of input one-dimensional interpolators, each of said input one-dimensional interpolators adapted to receive said discrete data values from the sources of a respective one of said data sets and said first output control signal from said control means and to develop an output signal continuously interpolating between the discrete data values of its associated data set;

c. multiplexer means for receiving said second output control signal from said control means, said multiplexer means having an output and having a plurality of inputs for simultaneously receiving in parallel said output signals from said input one-dimensional interpolators, said multiplexer means being adapted to sequentially gate, in a repetitive fashion, said output signals from said input one-dimensional interpolators to its output;

d. an output one-dimensional interpolator for receiving said third output control signal from said control means and said repetitively sequentially gated output from said multiplexer means for producing an output signal comprising, during each repetitive operation of said multiplexer means, a continuous interpolation of the data values presented at said multiplexer means output; and e. display means including horizontal and vertical deflection means for receiving said fourth output control signal from said control means and video means for receiving said output signal from said output one-dimensional interpolator, said display means producing therefrom said display.

22. Apparatus in accordance with claim 21, wherein said input one-dimensional interpolators and said output one-dimensional interpolator are recursive interpolators.

23. Apparatus in accordance with claim 21, wherein said source of discrete data values of each of said data sets comprises an array of spatially separated data sources the respective outputs of which comprise said plurality of successively occurring discrete data values.

24. Apparatus in accordance with claim 23, including a plurality of input multiplexer each having an output and a plurality of inputs, said inputs of each of said input multiplexers being connected to said data sources comprising one of said one-dimentional data source arrays, said control means being adapted to produce a fifth control signal, each of said input multiplexers receiving said fifth control signal and having said output thereof connected to one of said input one-dimensional interpolators, said outputs of said input multiplexers comprising said sources of said discrete data values.

25. Apparatus in accordance with claim 23, wherein each of said one-dimensional arrays of data sources comprise a one-dimensional array of transducers in proximity to a monitored condition.

26. Apparatus in accordance with claim 23, wherein each of said one-dimensional arrays of data sources comprise a one-dimensional array of thermocouples in proximity to the face of a continuous casting mold.

27. Apparatus in accordance with claim 21, wherein said source of discrete data values of each of said data sets comprises a time varying data source the output of each of said time varying data sources being connected to one of said input one-dimensional interpolators and comprising said sources of said discrete data values.

28. Apparatus in accordance with claim 24, wherein said control means includes a pulse source for producing a series of clock pulses at a predetermined frequency and a timing control circuit for producing said first, second, third, fourth and fifth output control signals, said third output control signal comprising a series of clock pulses having a frequency less than said predetermined frequency for controlling the rate of operation of said output one-dimensional interpolator, said second output control signal comprising a multiplexer gate address signal adapted to gate said multiplexer at a rate equivalent to said frequency of said third output control signal, said first output control signal comprising an input clock signal and said fifth output control signal comprising an input multiplexer gate address signal, said input clock signal comprising a series of clock pulses having a frequency less than said frequency of said third output control signal for simultaneously controlling the rate of operation of said input one-dimensional interpolators, said input multiplexer gate address signal being adapted to simultaneously gate said input multiplexers at a rate equivalent to said frequency of said input clock signal, and said fourth output control signal comprising first and second deflection signals for controlling said vertical and horizontal deflection means of said display means, said first deflection signal driving one of said deflection means at a rate proportional to said frequency of said third output control signal and said second deflection signal driving said other deflection means at a rate proportional to said input clock signal.

29. Apparatus in accordance with claim 28, wherein said control means includes at least first and second conversion means for producing, respectively, from said multiplexer gate address signal and said input multiplexer gate address signal, said first and second deflection signals.

30. Apparatus in accordance with claim 29, wherein said input multiplexer gate address signal and said multiplexer gate address signal are digital signals and said first and second conversion means comprise digital to analog converters, said first and said second deflection signals being multi-stepped deflection signals.

31. Apparatus in accordance with claim 29, wherein said control means includes first and second resolution means for developing, respectively, first and second resolution address signals, said first resolution address signal having a frequency less than said predetermined frequency and greater than said frequency of said input clock signal and being impressed upon said first conversion means for increasing the resolution of said first deflection signal, said second resolution address signal having a frequency greater than said input clock signal and less than said second output control signal and being impressed upon said second conversion means for increasing the resolution of said second deflection signal, said multiplexer and said output one-dimensional interpolator being caused to operate at a faster rate than said input multiplexers and said input one-dimensional interpolators by a factor equivalent to the ratio of said predetermined frequency to said frequency of said second resolution signal whereby, said output one-dimensional interpolator is caused to interpolate between corresponding discrete data values of said plurality of data sets a number of times equivalent to said ratio.

32. The method of producing, from a plurality of successively occurring discrete data values, a continuous display accurately reflecting said discrete data values and including interpolated data values intermediate each adjacent pair of said discrete data values, said method comprising the steps of:
 a. repetitively acquiring, in shifting progression, a predetermined number of consecutively occurring ones of said succession of discrete data values, each of said repetitive acquisitions defining a sample period; and
 b. producing a trace on a display continuously interconnecting said plurality of discrete data values, said trace comprising a repetitive series of interpolated segments each produced during a respective one of said sample periods and continuously connecting in adjacently occurring pair of discrete data values in each of said respectively acquired predetermined number of consecutively occurring discrete data values.

33. The method of claim 32, wherein said acquisition step is preceded by the step of monitoring the output data levels of a one-dimensional array of spatially separated data sources for generating said plurality of successively occurring discrete data values.

34. The method of claim 33, wherein said monitoring step is immediately followed by the step of multiplexing, in a successive manner, said monitored output data levels for generating said plurality of successively occurring discrete data values.

35. The method of claim 33, wherein said monitoring step consists of monitoring the outputs of a one-dimensional array of transducers positioned in proximity to a data producing condition.

36. The method of claim 33, wherein said monitoring step consists of monitoring the outputs of a one-dimensional array of thermocouples positioned in proximity to a continuous casting mold.

37. The method of claim 32, wherein said acquisition step is preceded by the step of monitoring the output data level of a time varying data source for generating said plurality of successively occurring discrete data values.

38. The method of claim 33, wherein said acquisition step consists of multiplexing, in a successive manner, said output data levels over a number of channels equivalent to said predetermined number of consecutively occurring discrete data values such that said channels carry said repetitively shifted predetermined number of consecutively occurring discrete data values.

39. The method of claim 34, wherein said acquisition step consists of repetitively causing the input shift element of an analog shift register means to sample said multiplexed data levels, said analog shift register means comprising a tandem of shift elements equivalent in number to said predetermined number of consecutively occurring discrete data values, said tandem of shift elements being caused to repetitively update in a successive manner concluding with said input shift element prior to each of said repetitive multiplexing steps.

40. The method of claim 32, wherein said step of developing interpolated segments comprises the step of developing linear interpolated segments.

41. The method of claim 40, wherein each of said repetitively acquired predetermined number of consecutively occurring discrete data values comprises a repetitively acquired first discrete data value and a repetitively acquired second discrete data value, each of said repetitively acquired first discrete data values occurring prior to its respective one of said repetitively acquired second discrete data values, said step of developing said linear interpolated segments comprising:
 a. repetitively developing an output difference signal representative of the value of said repetitively acquired second discrete data value less said repetitively acquired first discrete data value;
 b. repetitively developing an output ramp signal representative of the integrated value of said output difference signal sacaled by the reciprocal of the current period, each of said integration steps having a lower limit of zero and an upper limit equivalent to the value of said current period; and
 c. repetitively developing a linear output summation signal representative of the value of said output ramp signal added to said repetitively acquired first discrete data value.

42. The method of claim 32, wherein said step of developing interpolated segments comprises the step of developing third degree non-linear interpolated segments.

43. The method claim 42, wherein each of said repetitively acquired predetermined number of consecutively occurring discrete data values comprises, repetitively occurring in respective order, repetitively acquired first, second, third and fourth discrete data values, said step of developing third degree non-linear interpolated segments comprising of the step of performing, during each of said sample periods, the following operation:

$$B(t) = E_1 + \frac{1}{T} \int_0^T (E_{21} - a_0 E_{10}) \, dt + \frac{a_0}{T^2} \iint_0^{T/2} (E_{32} - 2E_{10}) \, dt^2$$
$$+ \frac{a_0}{T^3} \iiint_0^{T/6} (E_{10} - E_{32}) \, dt^3.$$

where,
$E_0$ = said repetitively acquired first occurring discrete data value,
$E_1$ = said repetitively acquired second occurring discrete data value,
$E_2$ = said repetitively acquired third occurring discrete data value,
$E_3$ = said repetitively acquired fourth ocurring discrete data value,
$E_{10} = E_1 - E_0$ ;
$E_{21} = E_2 - E_1$ ;
$E_{32} = E_3 - E_2$ ;
$T$ = the time duration of each of said periods,
$a_0$ = a predetermined constant value, and
B(t) comprises said repetitive series of third degree non-linear segments.

44. The method of producing, from a plurality of data sets, each of said data sets comprising a plurality of seccessively occurring discrete data values, a two-dimensionally interpolated trace on a display having vertical and horizontal deflection inputs and a video input, said method comprising the steps of:
 a. simultaneously producing, at a predetermined rate, a plurality of first continuous interpolations each continuously interconnecting the discrete data values of a respective one of said data sets;
 b. sequentially gating, in a repetitive fashion, said plurality of first continuous interpolations at a rate substantially faster than said predetermined rate;
 c. producing, during each repetitive operation performed in said gating step and at a rate equivalent to said rate of said gating step, a second continuous interpolation from the data values sequentially gated during the respective repetitive operation of said gating step; and
 d. sweeping one of said deflection input means at a rate proportional to said predetermined rate and said other deflection input of said display at a rate proportional to said rate of said multiplexing step while simultaneously driving said video input of said display with said second continuous interpolation.

45. The method of claim 44, wherein said step of producing said plurality of first continuous interpolations is preceded by the step of monitoring the output data levels of a plurality of one-dimensional arrays of spatially separated date sources, said output data levels of each of said one-dimensional arrays comprising said successively occurring discrete data values of a respective one of said data sets.

46. The method of claim 45, wherein said monitoring step is immediately followed by the step of simultaneously multiplexing, in a periodically successive and individual manner, said monitored output data levels of each of said one-dimensional arrays for generating said plurality of data sets.

47. The method of claim 45, wherein said monitoring step consists of monitoring the outputs of a plurality of one-dimensional arrays of transducers positioned in proximity to a data producing condition.

48. The method of claim 45, wherein said monitoring step consists of monitoring the outputs of a plurality of one-dimensional arrays of thermocouples positioned in proximity to a continuous casting mold.

49. The method of claim 44, wherein said step of producing said plurality of first continuous interpolations is preceded by the step of monitoring the output data levels of a plurality of time varying data sources, said output data levels of each of said time varying data sources comprising said successively occurring discrete data values of a respective one of said data sets.

* * * * *